United States Patent [19]
Hewett

[11] Patent Number: 6,096,131
[45] Date of Patent: Aug. 1, 2000

[54] SOLDER PASTE DEPOSITION

[75] Inventor: Paul Hewett, Clarkston, United Kingdom

[73] Assignee: International Business Machines Corporation, Armonk, N.Y.

[21] Appl. No.: 08/851,167

[22] Filed: May 1, 1997

Related U.S. Application Data

[62] Division of application No. 08/740,808, Nov. 1, 1996, abandoned.

[30] Foreign Application Priority Data

Nov. 25, 1995 [GB] United Kingdom ............... 9524174

[51] Int. Cl.⁷ ................................................. B05C 17/06
[52] U.S. Cl. .................... 118/504; 118/505; 428/615; 428/620; 428/601; 101/127; 156/252
[58] Field of Search ............................... 118/504, 505; 427/96, 272, 282, 358, 359; 428/615, 620, 601; 101/127; 156/252

[56] References Cited

U.S. PATENT DOCUMENTS

| | | | |
|---|---|---|---|
| 4,084,506 | 4/1978 | Nakatani | 101/127 |
| 4,176,602 | 12/1979 | Feddersen | 430/308 |
| 4,254,707 | 3/1981 | Lambert et al. | 101/123 |
| 4,692,205 | 9/1987 | Sachdev et al. | 156/643 |
| 4,693,209 | 9/1987 | Leicht | 118/213 |
| 4,735,694 | 4/1988 | Kukanskis | 204/15 |
| 4,803,110 | 2/1989 | Ahn et al. | 428/137 |
| 4,953,460 | 9/1990 | Wojcik | 101/129 |
| 5,129,573 | 7/1992 | Duffey | 228/180.1 |
| 5,197,234 | 3/1993 | Gillenwater | 118/504 |
| 5,277,749 | 1/1994 | Griffith et al. | 156/643 |
| 5,302,219 | 4/1994 | Hargis | 156/89 |
| 5,436,028 | 7/1995 | Becher et al. | 427/96 |

OTHER PUBLICATIONS

Van Nostrand's Scientific Encyclopedia, Sixth Edition, vol. 11, pp. 1674–1675.
Mechanical Engineers' Handbook, pp. 140–143.

*Primary Examiner*—Laura Edwards
*Attorney, Agent, or Firm*—Lawrence R. Fraley

[57] ABSTRACT

A multi-layer stencil is disclosed for applying solder paste to a printed circuit board. The stencil is formed from first and second layers of stencil material, e.g., stainless steel sheet, the second layer overlying the first layer in selected areas thereby forming a region of increased stencil thickness in those areas. A first plurality of apertures is defined through the thickness of the first layer only and a second plurality of apertures is defined through the combined thickness of the first and second layers in the selected regions. This type of multilevel stencil is useful for depositing differing thicknesses of solder paste onto a circuit board comprising a hybrid of through-hole and SMT devices.

11 Claims, 2 Drawing Sheets

SOLDER PASTE DEPOSITION

This is a divisional of application(s) Ser. No. 08/740,808 filed on Nov. 1, 1996 now abandoned.

TECHNICAL FIELD OF THE INVENTION

The present invention relates to a method of depositing solder paste onto a printed circuit board and also to a stencil employed in such a deposition method.

BACKGROUND OF THE INVENTION

Conventionally, solder used for bonding Surface Mounted Technology (SMT) devices to a printed circuit board (PCB) is deposited on the PCB in the form of a paste. The paste is usually deposited by a screen printing process using a stencil which precisely defines the portions of the PCB to be soldered. Apertures are formed in the stencil at positions corresponding to the required solder pad positions on the PCB. The paste is initially placed on the stencil surface remote from the PCB and forced through the apertures onto the PCB surface by means of a squeegee. The PCB is passed through an oven in which the solder paste melts, wets the pads and the leads of the SMT devices placed on the PCB, and solidifies to bond the devices to the pads. In today's PCB manufacturing environment, a typical stencil will be fabricated from stainless steel foil having a thickness of the order of 0.005 or 0.006 inches. This thickness is governed by the required pitch of the components being used on the PCB, which in this case will be 0.020 and 0.016 inches (referred to as 20 and 16 mil pitch).

Although use of SMT components generally offers high circuit densities, such components generally have significantly less mechanical strength in terms of their physical connection to the PCB than devices mounted by means of through-holes. It is therefore commonly required that components such as cable connectors and chip sockets have high mechanical strength and therefore this type of component is commonly attached by means of plated through-holes.

For plated through-hole devices, it is generally the case that an increased thickness of solder paste is required over and above that possible with standard 0.005 or 0.006 inch thick stencils. This requirement has conventionally been met by employing a separate mini-wave solder process. This however adds complexity and cost to the component attachment process. An alternative process, which avoids the need for an additional wave solder process is described in U.S. Pat. No. 5,129,573.

A further alternative process involves the use of a multi-level stencil, with areas of increased thickness defined where thicker solder paste is required. To date, multi-level stencils have been produced by chemical etching of defined areas of a thicker stencil foil. However, this production method has the disadvantage that the chemically etched portion is uneven in surface topology and thickness thus reducing the quality of the printing process in those areas where fine pitch printing is required.

What is needed therefore is an improved technique for depositing solder paste onto a PCB where varying solder paste thicknesses are required such as for PCBs comprising a combination of SMt and plated through-hole devices.

DISCLOSURE OF THE INVENTION

According to a first aspect of the invention there is provided a multilayer stencil for use in applying solder paste to a printed circuit board comprising: a first layer of stencil material having defined therein a first plurality of apertures; and a second layer of stencil material overlying a portion of the first stencil layer to form a region of increased stencil thickness, a second plurality of apertures being defined through the first and second layers in said region.

Preferably the stencil material of the first and second layers is stainless steel sheet.

According to a second aspect of the invention there is provided a method for applying solder paste to a printed circuit board comprising: locating a multilayer stencil adjacent to the printed circuit board, the stencil comprising a first layer of stencil material having defined therein a first plurality of apertures and a second layer of stencil material overlying a portion of the first stencil layer to form a region of increased stencil thickness, a second plurality of apertures being defined through the first and second layers in said region; and applying solder paste to the surface of the stencil away from the printed circuit board and forcing the solder paste through the first and second plurality of apertures onto the printed circuit board to thereby define, on the printed circuit board, areas of differing solder paste thickness at the locations of the first and second plurality of apertures.

The multilayer stencil of the present invention has the advantage over prior multi-level stencils in that it avoids the need to carry out chemical etching to produce a stencil of varying thickness. The critical region of the stencil wherein fine pitch apertures are defined thus has the surface and hence the surface properties of the original sheet material. The stencil and method of the present invention is advantageously employed in printing circuit boards which include a hybrid of SMT or plated through-hole components.

A preferred embodiment of the present invention will now be described, by way of example only, with references to the accompanying drawings.

DETAILED DESCRIPTION OF THE INVENTION

Figure 1A:
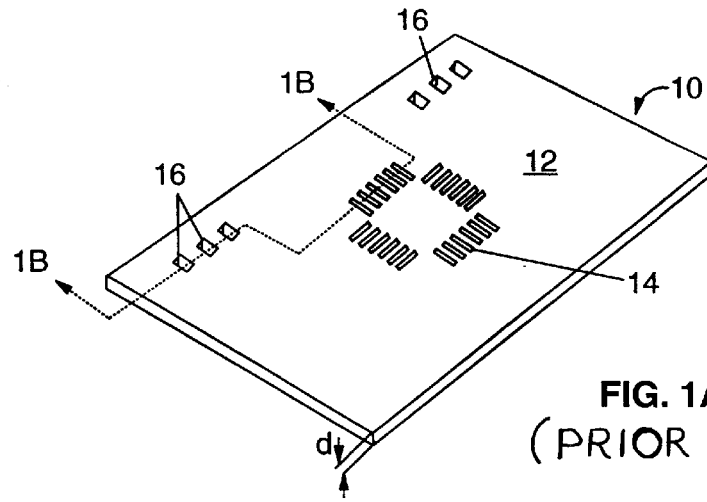
FIG. 1A is a perspective view of a conventional single layer stencil.

To put the preferred embodiment of the present invention to context, known stencil arrangements will first be described with reference to FIGS. 1 and 2. In FIG. 1A, there is shown a single layer plain surface stencil 10 which is fabricated from a suitable material such as rolled stainless steel foil having a thickness 'd' of typically 5 to 6 mils (1 mil=0.001 inches). The rolling process used to form such stencils produces a hard flat polished surface 12 and uniform stencil thickness; both of which properties are critical to the fabrication of high density circuit boards.

Figure 1B:
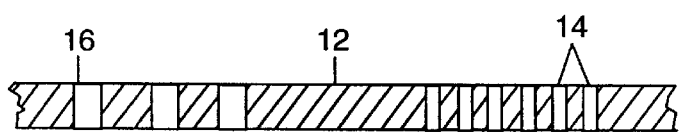
FIG. 1B is a cross sectional view along the line 'AA' shown in FIG. 1A.

Positioned toward the center of the stencil of FIG. 1A is an arrangement of fine pitch apertures 14 which are formed in the stencil by a laser cutting process. Positioned at the edge of the stencil in FIG. 1A are a row of wide pitch apertures 16 for defining the deposition locations of solder paste for plated through hole devices. FIG. 1B shows these apertures in a cross sectional view along line 'AA' of FIG. 1 A. As has been described, the use of a stencil which has a thickness sufficiently thin to produce fine pitch solder pads will not provide sufficient thickness of solder paste for the attachment of plated through-hole devices.

Figure 2A:
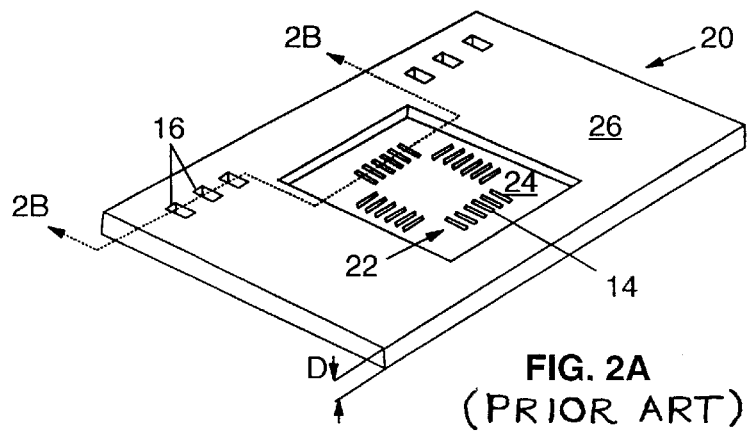
FIG. 2A is a perspective view of a prior art multi-layer stencil.
Figure 2B:
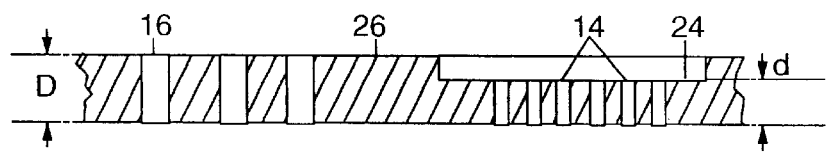
FIG. 2B is a cross sectional view along the line 'BB' shown in FIG. 2A.

Accordingly, FIG. 2A shows a prior art multi-level stencil 20 which is formed by starting with a stencil foil of increased thickness 'D'(e.g., 10 mils). The wide pitch apertures 16 are defined in the stencil to provide sufficient solder paste thickness for plated through-hole devices. A well is formed at the center of the stencil of FIG. 1 by a chemical etch process to define a region 22 of standard (i.e., 5 or 6 mil) thickness stencil for use in defining the fine-pitch apertures 14. FIG. 2B shows the apertures 14, 16 in a cross-sectional view along line 'BB' of FIG. 2A.

The major drawback of the FIG. 2 stencil is that the chemical etching process destroys the surface properties of the rolled stainless steel sheet. Thus chemical etching leaves the worst surface 24 at the most important areas of the stencil and leaves the best surface 26 at the least critical areas of the stencil.

Figure 3A:
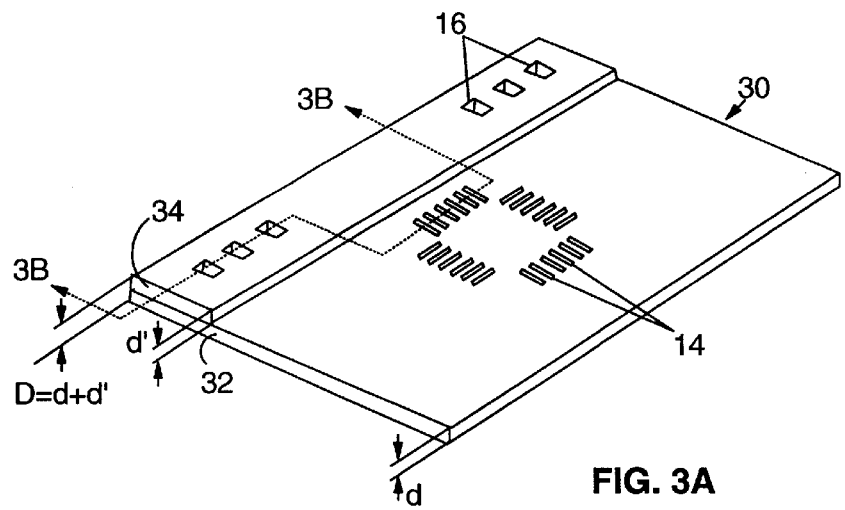
FIG. 3A is a perspective view of a multi-level laminated stencil according to a preferred embodiment of the invention.
Figure 3B:
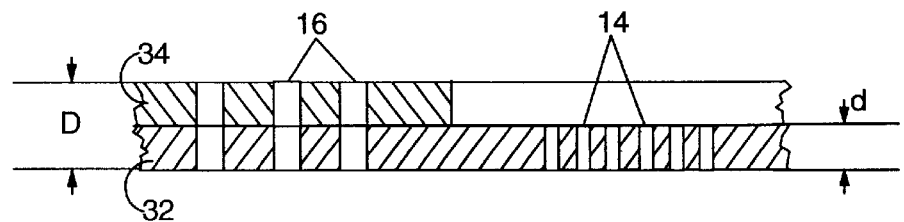
FIG. 3B is a cross sectional view along the line 'CC' shown in FIG. 3A.

An improved stencil according to a preferred embodiment of the invention is now described with reference to FIG. 3. The stencil 30 of FIG. 3A is a laminated stepped stencil wherein the required region of thicker stencil is created by the addition to a standard thickness stencil layer 32 (thickness=d) of an additional layer 34 of rolled stainless steel foil having the requisite thickness d'. The additional layer 34 is preferably laminated to layer 32 by means of an adhesive, e.g., epoxy adhesive. By this means, the region of layer 32 not overlaid by layer 34 has the uniform thickness and advantageous surface properties of rolled steel. The problems caused by chemical etching are thereby avoided. Apertures 14 and 16 are defined as required in the single or dual layer of the stencil. FIG. 3B shows the apertures 14 and 16 in cross-sectional view along line 'CC' of FIG. 3A.

Other methods of formation of the multi-level stencil may be envisaged which preserve the surface properties of the sheet material in the critical regions. One possibility is to plate a second layer of steel onto a foil base of 'standard' thickness. The surface of the upper layer produced by this method would be inferior to that of the rolled steel. However, this would be less critical for the wider pitch apertures used for plated-through hole devices.

Figure 4:
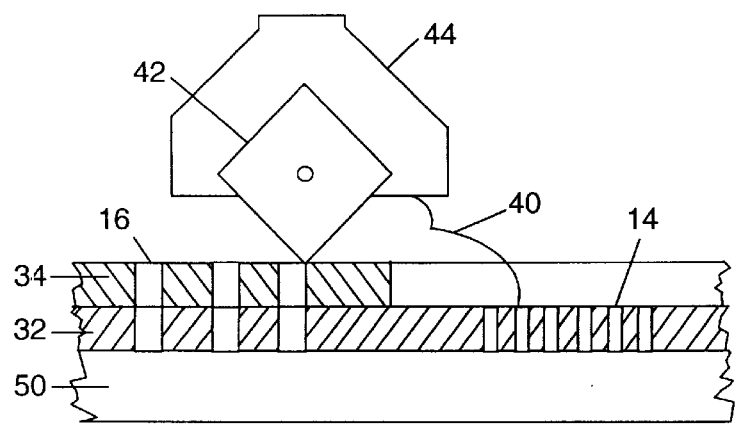
FIG. 4 is a side schematic view showing the screen printing process of the present invention.

With reference to FIG. 4, there is shown the solder paste printing process using the stencil form of FIG. 3. The stencil is located adjacent a printed circuit board 50 in the required position and solder paste 40 applied to the apertures 14 and 16 by means of a squeegee 42 mounted within a holder 44 traversing across the surface of the stencil from left to right or vice versa. The squeegee shown in FIG. 4 is one of the known type fabricated from polyurethane or similar material. It is more common today for squeegees to comprise a thin metal blade (e.g., of spring steel).

Note that the principle of the present invention can be employed to produce stencils having a surface topography which is more complex than that shown in FIGS. 3A and 3B. For instance, if necessary, the number of layers could be increased to three or more depending on the solder paste thickness requirements across the surface of the printed circuit board.

While there have been shown and described what are at present the preferred embodiments of the invention, it will be obvious to those skilled in the art that various changes and modifications may be made therein without departing from the scope of the invention as defined by the appended claims.

What is claimed is:

1. A multi-layered, laminate stencil for use in applying solder paste to a printed circuit board, said stencil comprising:

a first layer of metal material having defined therein first and second pluralities of apertures and at least one polished surface;

a second layer of metal material laminated to said first layer of metal material and overlying a selected portion of said at least one polished surface of said first layer to form a region of increased stencil thickness and to also leave exposed a portion of said at least one polished surface of said first layer having said first plurality of apertures therein, said second layer also including a polished surface and further including a third plurality of apertures therein, selected ones of said third plurality of apertures aligning with selected ones of said second plurality of apertures in said first layer.

2. A stencil as claimed in claim 1, each of said first and second layers comprising stainless steel foil.

3. A stencil as claimed in claim 1 wherein said aligned second and third pluralities of apertures are of greater pitch than said first plurality of apertures.

4. A stencil as claimed in claim 1 further including a quantity of adhesive material, said adhesive material bonding said first layer of metal material to said second layer of metal material.

5. A stencil as claimed in claim 1 wherein said polished surfaces of said first and second layers of metal material are not chemically etched.

6. A stencil as claimed in claim 5 wherein said first layer of metal material is of uniform thickness.

7. A multi-layered stencil for use in applying solder paste to a printed circuit board, said stencil comprising:

a first layer of metal material having defined therein first and second pluralities of apertures and at least one polished surface; and a second layer of metal plated onto said first layer and overlying a selected portion of said at least one polished surface of said first layer to form a region of increased stencil thickness and to also leave exposed a portion of said at least one polished surface of said first layer having said first plurality of apertures therein, said second layer plated onto said first layer including a third plurality of apertures therein, selected ones of said third plurality of apertures aligning with selected ones of said second plurality of apertures in said first layer.

8. A stencil as claimed in claim 7 wherein said first layer is comprised of stainless steel foil.

9. A stencil as claimed in claim 7 wherein said aligned second and third pluralities of apertures are of greater pitch than said first plurality of apertures.

10. A stencil as claimed in claim 7 wherein said at least one polished surface of said first layer is not chemically etched.

11. A stencil as claimed in claim 10 wherein said second layer of metal includes a second surface, said second surface not being chemically etched.

* * * * *